(12) United States Patent
Huang et al.

(10) Patent No.: US 10,942,456 B1
(45) Date of Patent: Mar. 9, 2021

(54) DEVICE OF LIGHT SOURCE WITH DIODE ARRAY EMITTING HIGH-UNIFORMITY ULTRAVIOLET

(71) Applicant: National Applied Research Laboratories, Taipei (TW)

(72) Inventors: Jiun-Woei Huang, Taipei (TW); Min-Wei Hung, Hsinchu (TW); Kuo-Cheng Huang, Hsinchu (TW)

(73) Assignee: National Applied Research Laboratories, Taipei (TW)

( * ) Notice: Subject to any disclaimer, the term of this patent is extended or adjusted under 35 U.S.C. 154(b) by 0 days.

(21) Appl. No.: 16/745,475

(22) Filed: Jan. 17, 2020

(51) Int. Cl.
*G03F 7/20* (2006.01)

(52) U.S. Cl.
CPC .......... *G03F 7/7005* (2013.01); *G03F 7/7015* (2013.01); *G03F 7/7035* (2013.01); *G03F 7/70075* (2013.01)

(58) Field of Classification Search
CPC ............ H01L 21/0274; H01L 21/0231; H01L 21/02348; G02B 27/30; G03F 7/70008; G03F 7/7005; G03F 7/70058; G03F 7/70066; G03F 7/70075; G03F 7/70083; G03F 7/70091; G03F 7/7015; G03F 7/70183; G03F 7/70191; G03F 7/7035; G03F 7/70375; G03F 7/70908; G03F 7/70916; G03F 7/2002; G03F 7/2004; G03F 7/70383; G03F 7/70391

USPC ..... 355/46, 52–55, 67–77; 250/492.1, 492.2, 250/492.22, 492.24, 493.1, 494.1, 503.1, 250/504 R
See application file for complete search history.

(56) References Cited

U.S. PATENT DOCUMENTS

| | | | | |
|---|---|---|---|---|
| 5,724,122 A * | 3/1998 | Oskotsky | ............ | G03F 7/70066 355/67 |
| 2004/0227103 A1* | 11/2004 | Singer | ................. | G03F 7/70825 250/492.1 |
| 2006/0215143 A1* | 9/2006 | Yamaguchi | ......... | G03F 7/70466 355/69 |
| 2008/0111983 A1* | 5/2008 | Singer | ................. | G03F 7/70083 355/69 |
| 2008/0192359 A1* | 8/2008 | Sohmer | .............. | G02B 17/0892 359/649 |
| 2018/0364586 A1* | 12/2018 | Clube | ................... | G03F 7/7035 |

\* cited by examiner

*Primary Examiner* — Christina A Riddle
(74) *Attorney, Agent, or Firm* — Demian K. Jackson; Jackson IPG PLLC

(57) ABSTRACT

An ultraviolet (UV) light source is provided. The device uses a high-uniformity diode array. A lens unit of collimated illumination lenses is used. A light source of UV light-emitting diode (UVLED) array is formed and passes through the lens unit to uniformly distribute the light source and obtain a collimated light. The present invention comprises a light source of UVLED array; a collimated illumination lens unit; and a substrate. The construction is simple. The present invention can be applied in the lithography of a semiconductor. The lithography forms contact lines of widths not greater than 3 microns (μm); soft-contact lines of widths of 3~30 μm; and short-spaced lines of widths of 30~200 μm. The present invention avoids the mask from contact wear-out for multiple uses, and further reduces the replacement rate.

6 Claims, 4 Drawing Sheets

DEVICE OF LIGHT SOURCE WITH DIODE ARRAY EMITTING HIGH-UNIFORMITY ULTRAVIOLET

TECHNICAL FIELD OF THE INVENTION

The present invention relates to a a diode array emitting high-uniformity ultraviolet (UV); more particularly, to a collimated illumination lens unit, where a light source of UV light-emitting diode (UVLED) array passes through a lens unit to uniformly distribute the light source and to collimate in order to avoid wearing out the mask from multiple contact processes and to further reduce the the mask replacement rate.

DESCRIPTION OF THE RELATED ARTS

A mask aligner of a direct-exposure semiconductor exposing machine has a main parameter of the evenness of light intensity, which can be summarized as follows: an exposure lens unit of 365 nanometers maps an illuminating image of a mask of a microcircuit to a wafer with photoresist. After being exposed for a period of time through processes of developing, baking, etching, and resistance-removing, wiring, packaging, and testing as what follows are processed to an electronic device. Therein, the line width of the microcircuit determines the smallest dimension specification of the electronic device, which is also the main indicator of a host function of the mask aligner.

Currently, most of the parallel-light-exposure devices use mercury lamps as light sources. Yet, high-pressure mercury lamps are highly heated and bulky and their lives are very short (typically only 800 hours) while high-power mercury lamps are costly to produce, both with an average mercury content reaching 35 mg (equivalent to a lethal dose of rabbit). They not only pollute the environment, are bulky, and have short lives they also have limited use-scopes. According to the Minamata Convention, the production as well as import and export of mercury batteries and fluorescent lamps that exceed a certain amount of mercury are prohibited after 2020. Therefore, this kind of mercury lamps are under constraint.

Due to the above-mentioned disadvantages of mercury lamps, high-power UVLEDs with advantages of high efficiency, long life and narrow lines, etc. have their emergence to becomes ideal light sources for replacing the mercury lamps. The UVLED light source is used in exposure devices. The light sources have two indexes to be focused on, which are the optical parallel degree and the uniformity of entire lamp.

However, a single UVLED has little energy and is used as a collimated light only. To achieve an energy density comparable to the mercury lamps, several ones of the UVLED light source must be arranged in an array to form a UVLED array for obtaining enough energy. But, the UVLED divergence angle is great; the dot matrix of arranged UVLEDs belongs a surface light source; and the luminous efficiency of each UVLED is different. Hence, because the light source of UVLED array has a large distribution area with an uneven optical-field intensity distribution, the efficient use of energy is difficult and is a significant disadvantage. Even by using other forms of distribution, such as distribution using laminated layers or probability distribution, the desired uniformity is still difficult to achieve.

Hence, the prior arts do not fulfill all users' requests on actual use.

SUMMARY OF THE INVENTION

The main purpose of the present invention is to provide a collimated illumination lens unit, where a light source of UVLED array passes through a lens unit to uniformly distribute the light source and make rays collimated.

Another purpose of the present invention is to provide a simple construction by applying a lithography of a semiconductor for forming a direct-contact light source, a closely-spaced light source, or an indirect-exposure light source as avoiding a mask from contact wear-out for multiple uses, and further reducing the replacement rate.

To achieve the above purpose, the present invention is a device of light source with a diode array emitting high-uniformity UV, comprising a light source of UVLED array, a collimated illumination lens unit, and a substrate, where the light source of UVLED array comprises a plurality of UVLEDs to emit UV rays of diode array through an entrance pupil; the collimated illumination lens unit is set at a side of the light source of UVLED array; the collimated illumination lens unit comprises a front lens unit and a rear lens unit; the front lens unit has a 1.3±0.1 ratio of focal length to the rear lens unit; the UV rays of diode array enter through the entrance pupil to be intersected on a position of a mask; each ray of a single UVLED emitted from a various position in array is parallel to each other at the same angle of view to obtain uniform distribution of light intensity on cross section of light and make rays collimated at each field angle; and the substrate is set at a side of the mask to focus the UV rays of diode array, which pass through the collimated illumination lens unit, on the position of the mask to be mapped on the substrate afterwards.

BRIEF DESCRIPTION OF THE DRAWINGS

The present invention will be better understood from the following detailed description of the preferred embodiment according to the present invention, taken in conjunction with the accompanying drawings, in which.

DESCRIPTION OF THE PREFERRED EMBODIMENT

The following description of the preferred embodiment is provided to understand the features and the structures of the present invention.

Figure 1:
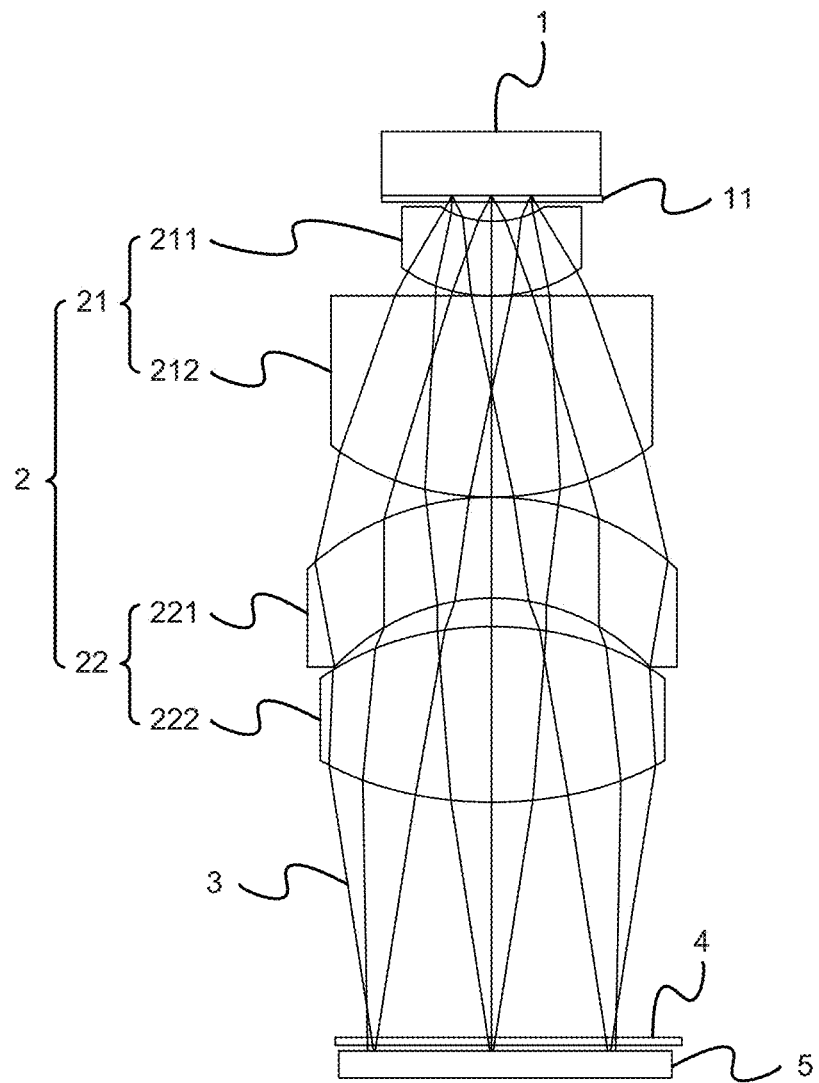
FIG. 1 is the structural view showing the preferred embodiment according to the present invention.
Figure 2:
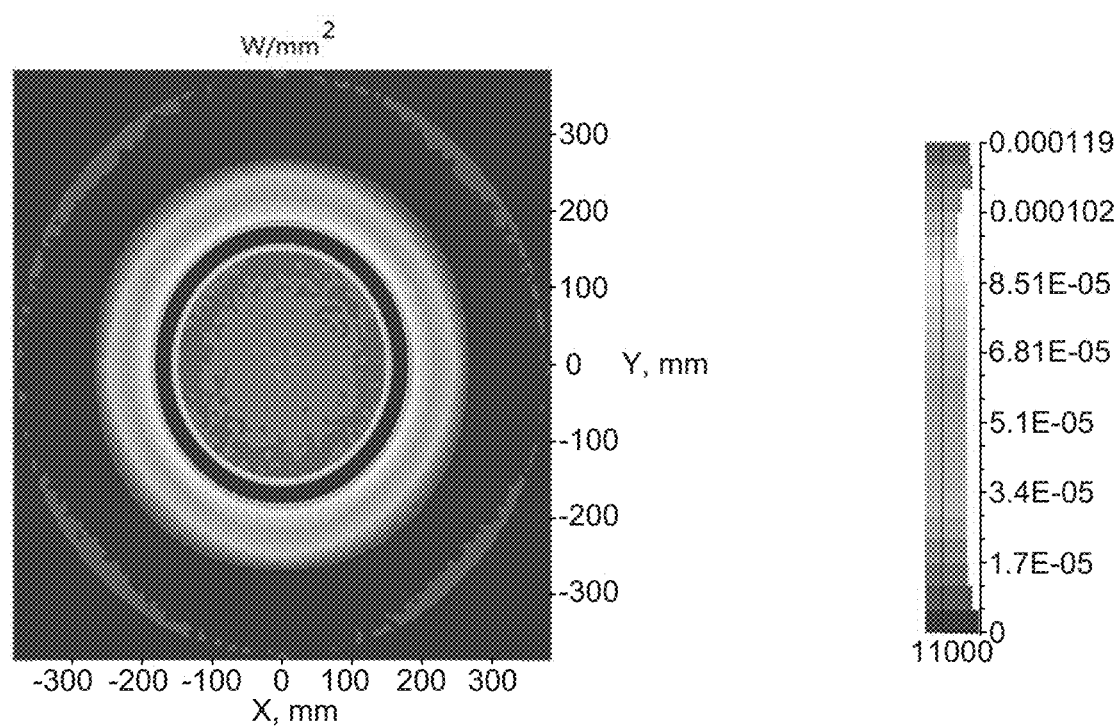
FIG. 2 is the simulation view showing the output of the light source.
Figure 3:
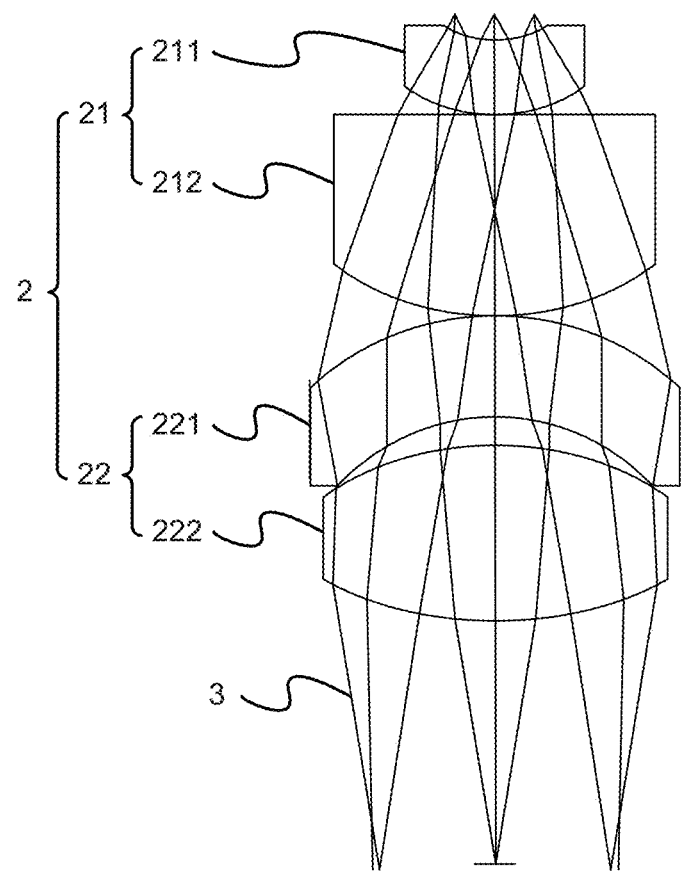
FIG. 3 and FIG. 4 are the sectional views showing the first and the second preferred embodiments of the collimated illumination lens units.
Figure 4:
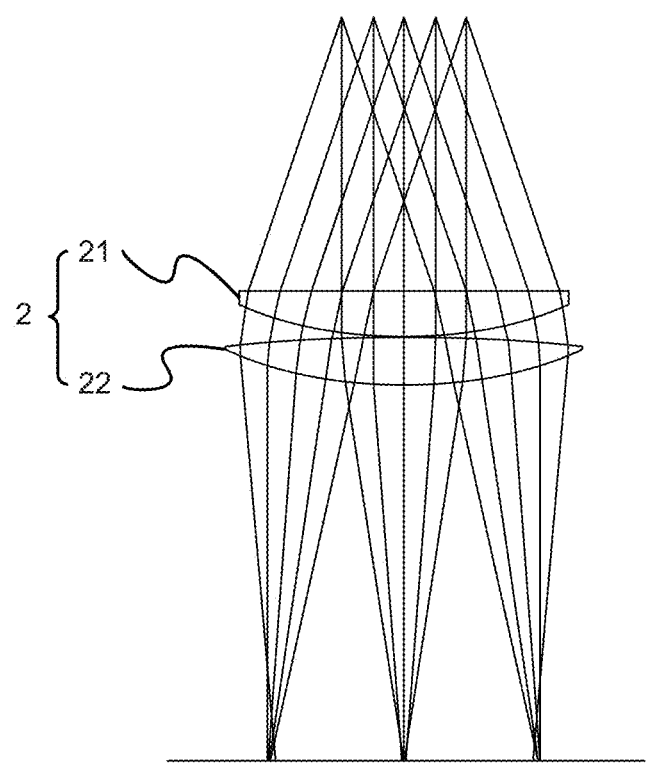

Please refer to FIG. 1 to FIG. 4, which are a structural view showing a preferred embodiment according to the present invention; a simulation view showing the output of a light source; and FIG. 3 and FIG. 4 are sectional views showing a first and a second preferred embodiments of collimated illumination lens units. As shown in the figures, the present invention is a device of light source with a diode array emitting high-uniformity ultraviolet (UV), comprising a light source of UV light-emitting diode (UVLED) array 1, a collimated-illumination lens set 2; and a substrate 5.

The light source of UVLED array 1 comprises a plurality of UVLEDs to emit UV rays of diode array through an entrance pupil 11.

The collimated illumination lens unit 2 is set at a side of the light source of UVLED array 1, which comprises a front lens unit 21 and a rear lens unit 22. The front lens unit 21 has a 1.3±0.1 ratio of focal length to the rear lens unit 22. The UV rays of diode array enter through the entrance pupil 11 to be intersected on a position of a mask 4 so that each ray 3 emitted from a single UVLED at a various position in array is parallel to each other at the same angle of view to obtain uniform distribution of light intensity on cross section of light and make the ray 3 collimated at each field angle.

The substrate 5 is set at a side of the mask 4 to focus the rays, which pass through the collimated illumination lens unit 2, to be mapped on the substrate 5 afterwards. Thus, a novel device of light source with a diode array emitting high-uniformity UV is obtained.

On using the present invention, UV rays of diode array enter through a entrance pupil 11 to be intersected on a position of a mask 4, as shown in FIG. 1. Each ray 3 emitted from a single UVLED at a various position in array is parallel to each other at the same angle of view to obtain a uniformity ratio of light intensity distribution greater than 98% on cross-section of outputted light and make the ray 3 collimated at each field angle with a telecentric deviation not greater than 0.3 degrees at the field angle. The horizontal deviation of ray is not greater than 0.3 degrees at the same field angle. Consequently, the rays 3, which pass through the collimated illumination lens unit 2, are focused on the position of the mask 4 and, then, mapped on the substrate 5. The mask 4 and the substrate 5 is processed with a lithography to form one or more of a contact line having a width not greater than 3 microns (μm); a soft-contact line having a width of 3~30 μm; or a short-spaced line having a width of 30~200 μm, as shown in FIG. 2 of a simulation view showing the output of a light source as being applied to a direct-contact light source, a closely-spaced light source, or an indirect-exposure light source for avoiding contact wear-out.

In a first preferred embodiment, the collimated-illumination lens unit 2 comprises four lenses of a first lens 211, a second lens 212, a third lens 221, and a fourth lens 222. Therein, the first and the third lenses 211,221 are negative lenses and the second and the fourth lenses 212,222 are positive lenses; and the first and the second lenses 211,212 compose the front lens unit 21 having a positive composite focal length and the third and the fourth lenses 221,222 compose the rear lens unit 22 having a positive composite focal length, where the focal length has a ratio of 1.3±0.1, as shown in FIG. 3.

In a second preferred embodiment, the collimated illumination lens unit 2 comprises two lens to form the front lens unit 21 and the rear lens unit 22, separately. The front lens unit 21 has a positive composite focal length; the rear lens unit 22 has a positive composite focal length; and each of the focal lengths has a ratio of 1.3±0.1, as shown in FIG. 4.

Conventionally, a light source of UVLED array has a large distribution area with an uneven optical-field intensity distribution. The present invention uses a collimated-illumination lens unit, where a light source of UVLED array passes through lens set to uniformly distribute the light source and make rays collimated. Thus, since the present invention only comprises three components of a light source of UVLED array, a collimated-illumination lens unit, and a substrate, the construction is simple; and a lithography of a semiconductor is applied to form at least a contact line having a width not greater than 3 μm, a soft-contact line having a width of 3~30 μm, and a short-spaced line having a width of 30~200 μm as avoiding the mask from contact wear-out for multiple uses, and further reducing the replacement rate.

To sum up, the present invention is a device of light source with a diode array emitting high-uniformity UV, where a collimated-illumination lens unit is used with UV rays of diode array entering through a entrance pupil to be intersected on a position of a mask; each ray emitted from a single UVLED at a various position in array is parallel to each other at the same angle of view to obtain a uniformity ratio of light intensity distribution greater than 98% on cross-section of outputted light and make rays collimated at each field angle; and the present invention is applied in a direct-contact light source, a closely-spaced light source, or an indirect-exposure light source.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A device having a light source with a diode array emitting high-uniformity ultraviolet (UV) light, comprising
   the light source comprising the UV light emitting diode (UVLED) array, wherein said UVLED array comprises a plurality of UVLEDs to emit UV rays from the diode array through an entrance pupil;
   a collimated illumination lens unit,
      wherein said collimated illumination lens unit is disposed at a side of said UVLED array light source; said collimated illumination lens unit comprises a front lens unit and a rear lens unit; wherein the ratio of the focal length of the front lens unit to the focal length of the rear lens unit is 1.3±0.1; said UV rays from the UVLED array enter through said entrance pupil to be intersected on a position of a mask; and each ray of a single UVLED emitted from a position in the array is parallel to the other rays emitted from other UVLEDs in the array at the same angle of view to obtain a uniform distribution of light intensity on a cross section of light and to collimate the rays at each field angle; and
   a substrate,
      wherein said substrate is disposed at a side of said mask to focus said UV rays of the UVLED array, which pass through said collimated illumination lens unit, on said position of said mask to be mapped on said substrate afterwards,
      wherein each one of said rays has a telecentric deviation not greater than 0.3 degrees at each field angle; and each one of said rays has a horizontal deviation not greater than 0.3 degrees at the same field angle.

2. The device according to claim 1,
   wherein said collimated illumination lens unit comprises a first lens, a second lens, a third lens and a fourth lens; said first and said third lenses are negative lenses; said second and said fourth lenses are positive lenses; said first and said second lenses compose said front lens unit having a positive composite focal length; and said third and said fourth lenses compose said rear lens unit having a positive composite focal length.

3. The device according to claim 1,
wherein said collimated illumination lens unit comprises two lenses to obtain said front lens unit and said rear lens unit, separately; said front lens unit has a positive composite focal length; and said rear lens unit has a positive composite focal length.

4. The device according to claim 1,
wherein said collimated-illumination lens unit has a uniformity ratio of light intensity distribution greater than 98% on a cross-section of outputted light.

5. The device according to claim 1,
wherein the device is part of a lithography apparatus used to process a semiconductor device to obtain at least a line selected from a group consisting of a contact line having a width not greater than 3 microns ($\mu$m); a contact line having a width of 3~30 $\mu$m; and a short-spaced line having a width of 30~200 $\mu$m.

6. The device according to claim 1,
wherein the device is a light source used in an exposure apparatus selected from a group consisting of a light source in the form of an exposure apparatus that is a direct contact lithography device, a light source spaced apart from the mask, and an indirect-exposure light source.

* * * * *